(12) United States Patent
Cummings

(10) Patent No.: US 7,556,981 B2
(45) Date of Patent: Jul. 7, 2009

(54) SWITCHES FOR SHORTING DURING MEMS ETCH RELEASE

(75) Inventor: William J. Cummings, Millbrae, CA (US)

(73) Assignee: Qualcomm MEMS Technologies, Inc., San Diego, CA (US)

(*) Notice: Subject to any disclaimer, the term of this patent is extended or adjusted under 35 U.S.C. 154(b) by 161 days.

(21) Appl. No.: 11/647,822

(22) Filed: Dec. 29, 2006

(65) Prior Publication Data

US 2008/0160251 A1    Jul. 3, 2008

(51) Int. Cl.
*H01L 21/00* (2006.01)
(52) U.S. Cl. .......................................... 438/72
(58) Field of Classification Search ............. 438/48–55, 438/69–72
See application file for complete search history.

(56) References Cited

U.S. PATENT DOCUMENTS

| | | | |
|---|---|---|---|
| 4,954,789 | A | 9/1990 | Sampsell |
| 5,018,256 | A | 5/1991 | Hornbeck |
| 5,099,353 | A | 3/1992 | Hornbeck |
| 5,481,274 | A | 1/1996 | Aratani et al. |
| 5,483,260 | A | 1/1996 | Parks et al. |
| 5,650,834 | A | 7/1997 | Nakagawa et al. |
| 5,784,189 | A | 7/1998 | Bozler et al. |
| 6,040,937 | A | 3/2000 | Miles |
| 6,246,398 | B1 | 6/2001 | Koo |
| 6,323,982 | B1 | 11/2001 | Hornbeck |
| 6,433,917 | B1 | 8/2002 | Mei et al. |
| 6,446,486 | B1 | 9/2002 | De Boer et al. |
| 6,552,840 | B2 | 4/2003 | Knipe |
| 6,574,033 | B1 | 6/2003 | Chui et al. |
| 6,650,455 | B2 | 11/2003 | Miles |
| 6,674,562 | B1 | 1/2004 | Miles et al. |
| 6,680,792 | B2 | 1/2004 | Miles |
| 6,710,908 | B2 | 3/2004 | Miles et al. |
| 6,750,876 | B1 | 6/2004 | Atsatt et al. |
| 6,781,643 | B1 | 8/2004 | Watanabe et al. |
| 6,813,060 | B1 | 11/2004 | Garcia et al. |

(Continued)

FOREIGN PATENT DOCUMENTS

EP    1 640 330    3/2006

(Continued)

OTHER PUBLICATIONS

Miles et al., 5.3: Digital PaperTM: Reflective displays using interferometric modulation, SID Digest, vol. XXXI, 2000 pp. 32-35.

(Continued)

*Primary Examiner*—Richard A. Booth
(74) *Attorney, Agent, or Firm*—Knobbe, Martens, Olson & Bear LLP

(57) ABSTRACT

A MEMS (Microelectromechanical system) device is described. The device includes a first layer on a substrate, and a sacrificial layer on or over the first layer, the first sacrificial layer being configured to be removed in a removal procedure. The device also includes a second layer on or over the first sacrificial layer, where the second layer is spaced apart from the first layer, and a shorting element electrically connecting the first and second layers, where at least a portion of the shorting element is removable in the removal procedure.

16 Claims, 14 Drawing Sheets

U.S. PATENT DOCUMENTS

| | | |
|---|---|---|
| 6,903,860 B2 | 6/2005 | Ishii |
| 7,123,216 B1 | 10/2006 | Miles |
| 7,161,728 B2 | 1/2007 | Sampsell et al. |
| 7,196,837 B2 | 3/2007 | Sampsell et al. |
| 7,327,510 B2 | 2/2008 | Cummings et al. |
| 2002/0000959 A1 | 1/2002 | Colgan et al. |
| 2002/0024711 A1 | 2/2002 | Miles |
| 2004/0026757 A1 | 2/2004 | Crane et al. |
| 2004/0046920 A1 | 3/2004 | Hayata et al. |
| 2005/0122560 A1 | 6/2005 | Sampsell et al. |
| 2005/0168431 A1 | 8/2005 | Chui |
| 2005/0286114 A1 | 12/2005 | Miles |
| 2006/0044928 A1 | 3/2006 | Chui et al. |
| 2006/0066598 A1 | 3/2006 | Floyd |
| 2006/0066935 A1 | 3/2006 | Cummings et al. |
| 2006/0077502 A1 | 4/2006 | Tung et al. |
| 2006/0103613 A1 | 5/2006 | Chui |

FOREIGN PATENT DOCUMENTS

| | | |
|---|---|---|
| EP | 1 640 962 | 3/2006 |
| JP | 07 333275 | 12/1995 |
| JP | 2002-175053 | 6/2002 |
| JP | 2004004553 | 8/2004 |
| KR | 2003 0030470 | 4/2003 |
| WO | WO 03/007049 A1 | 1/2003 |
| WO | WO 2004/026757 | 4/2004 |
| WO | WO 2006/012178 | 11/2006 |

OTHER PUBLICATIONS

ISR and WO for PCT/US07/026288, filed Dec. 20, 2007.
ISR and WO for PCT/US07/ 026291, filed Dec. 20, 2007.
Miles, MEMS-based interferometric modulator for display applications, Part of the SPIE Conference on Micromachined Devices and Compounds, vol. 3876, pp. 20-28 (1999).

SWITCHES FOR SHORTING DURING MEMS ETCH RELEASE

BACKGROUND

1. Field of the Invention

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One embodiment is a method of manufacturing a MEMS (microelectromechanical system) device. The method includes forming a first layer on a substrate, forming a sacrificial layer on or over the first layer, the sacrificial layer configured to be removed in a removal procedure, forming a second layer on or over the first sacrificial layer, where the second layer is spaced apart from the first layer, and forming a shorting element electrically connecting the first and second layers, where at least a portion of the shorting element is removable in the removal procedure.

Another embodiment is a MEMS (Microelectromechanical system) device including a first layer on a substrate, and a sacrificial layer on or over the first layer, the first sacrificial layer configured to be removed in a removal procedure. The device also includes a second layer on or over the first sacrificial layer, where the second layer is spaced apart from the first layer, and a shorting element electrically connecting the first and second layers, where at least a portion of the shorting element is removable in the removal procedure.

Another embodiment is a MEMS (Microelectromechanical system) device including an array of MEMS elements including first and second conductive layers, and means for electrically connecting and disconnecting the first and second layers during an etching process.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Interferometric modulators described below sometimes suffer manufacturing yield loss because of large electric fields which occur during removal of a sacrificial layer during fabrication. Embodiments discussed below include switches which temporarily electrically short sensitive layers so as to prevent the electric fields from developing. The switches are configured to short the sensitive layers during the fabrication steps during which the damaging electric fields develop, and to remain open thereafter. Similarly, testing of an array of interferometric modulators with many row lines and column lines requires many input signals. Embodiments discussed below include switches which temporarily electrically short subsets of rows and/or columns so that fewer input signals may be used. The switches are configured to short the subsets during the testing operation, and to remain open thereafter.

Figure 1:
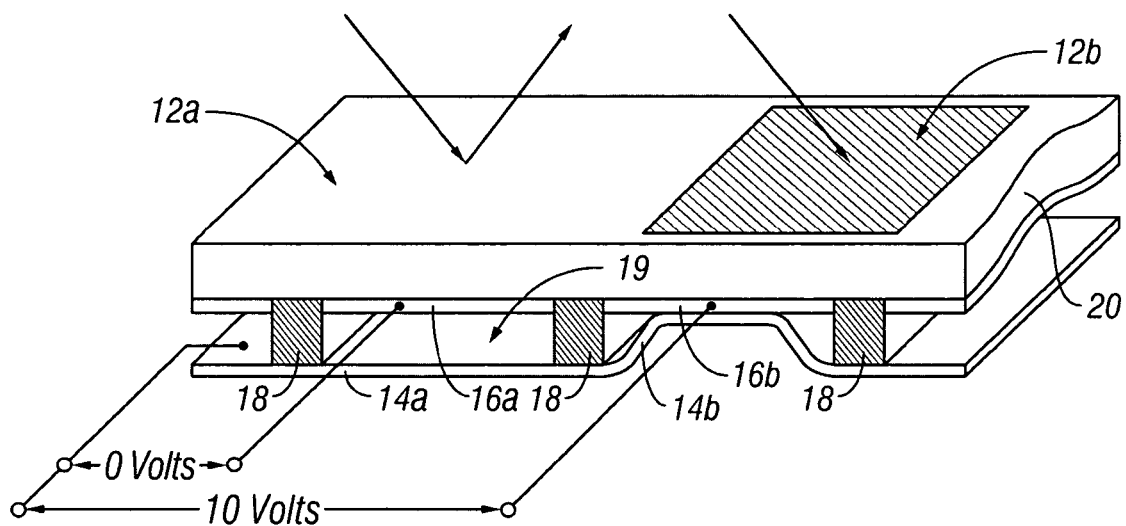
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
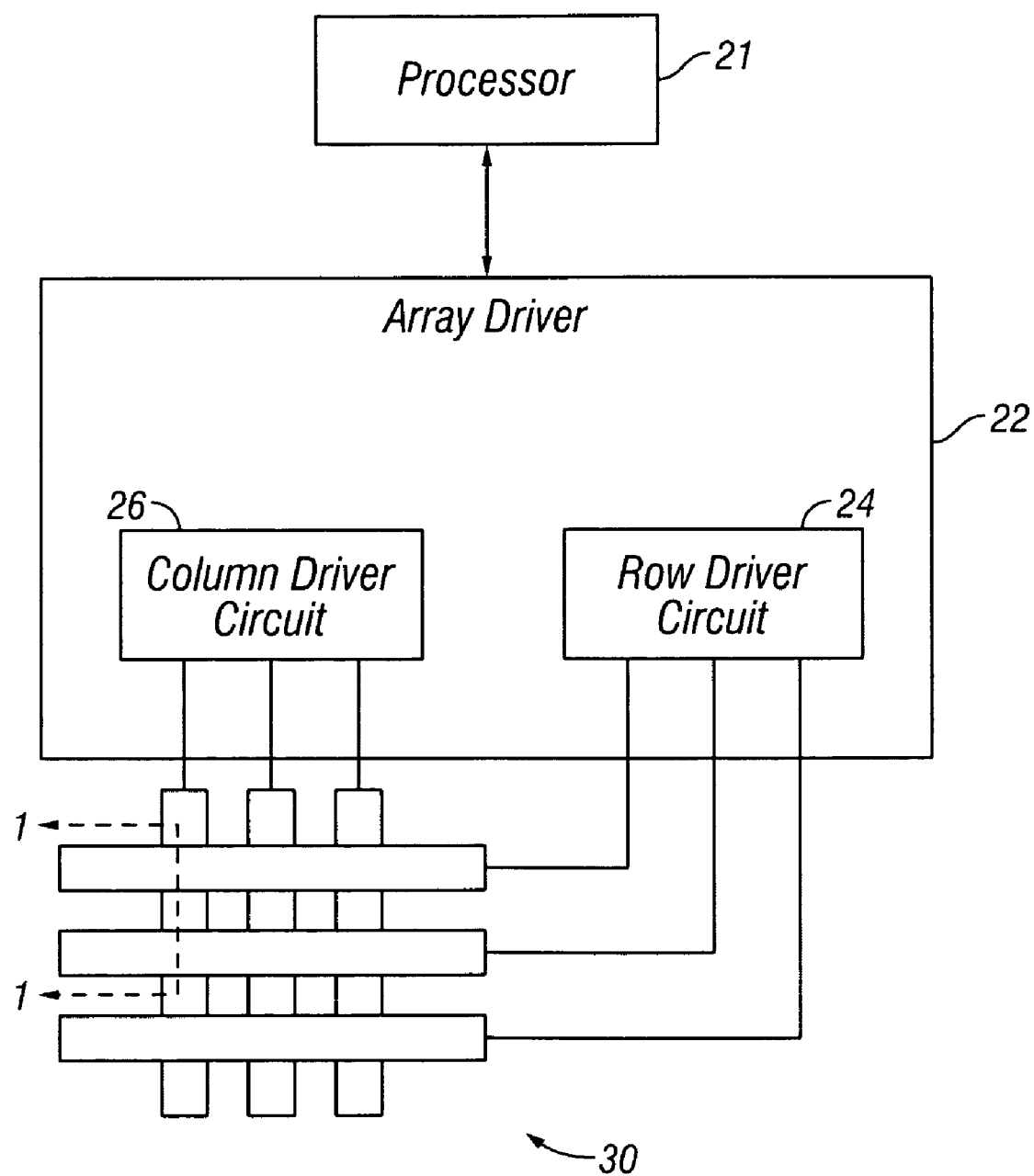
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
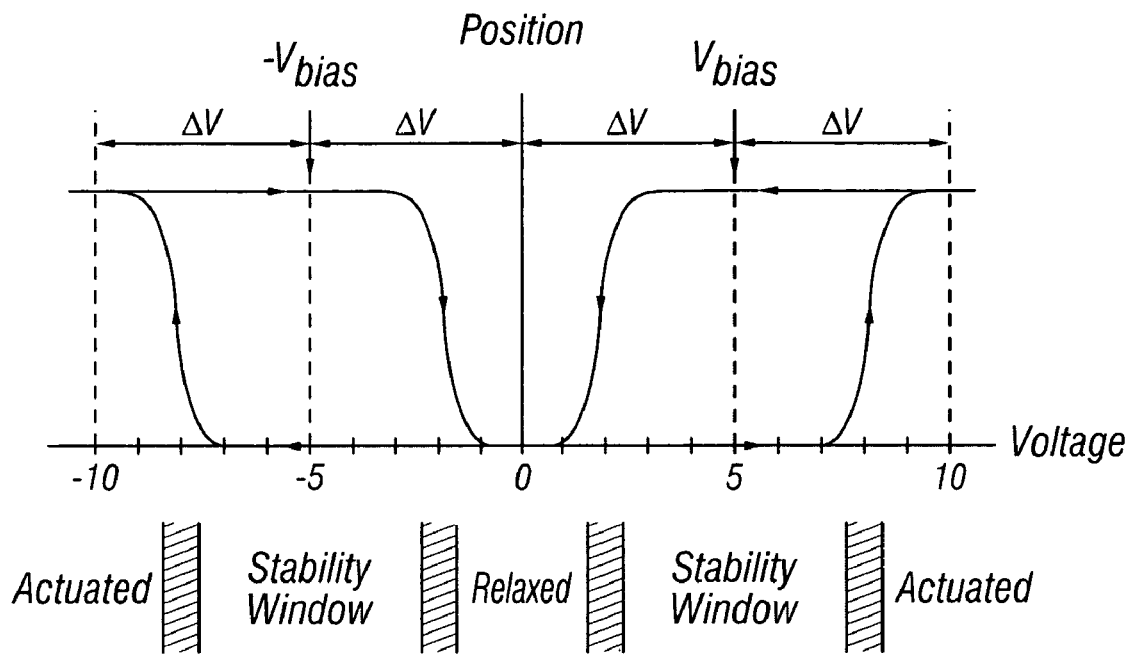
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
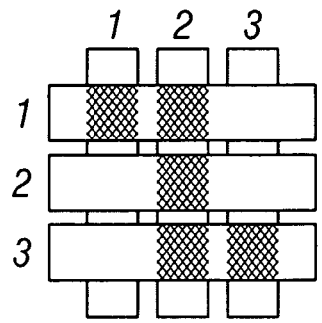
FIG. 5A illustrates one exemplary frame of display data in the 3×3 interferometric modulator display of FIG. 2.
Figure 5B:
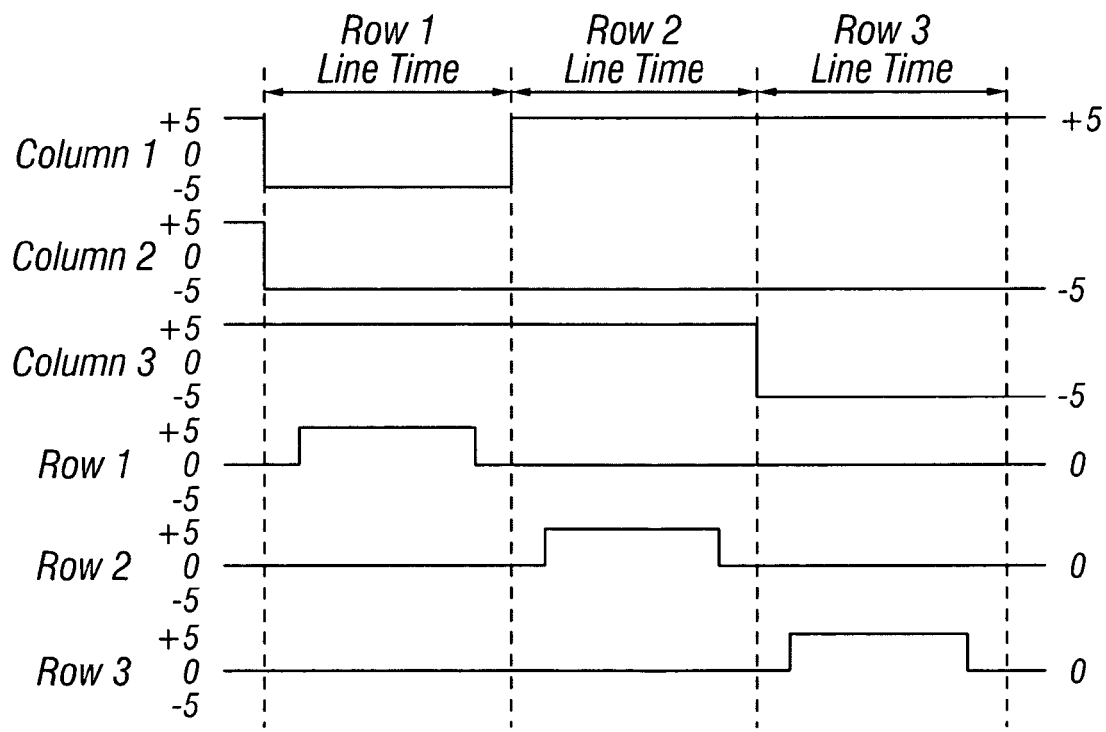
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
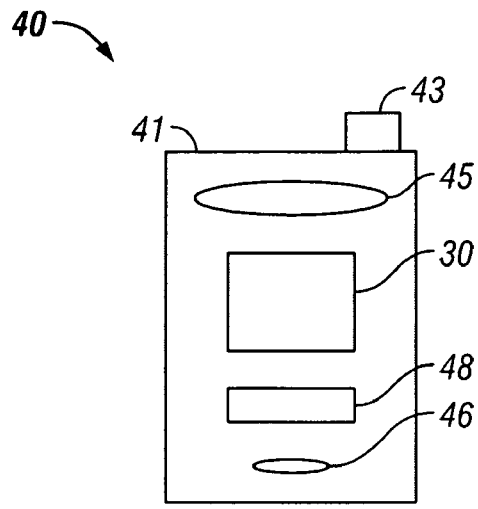
FIGS. 6A and 6B are system block diagrams illustrating an embodiment of a visual display device comprising a plurality of interferometric modulators.
Figure 6B:
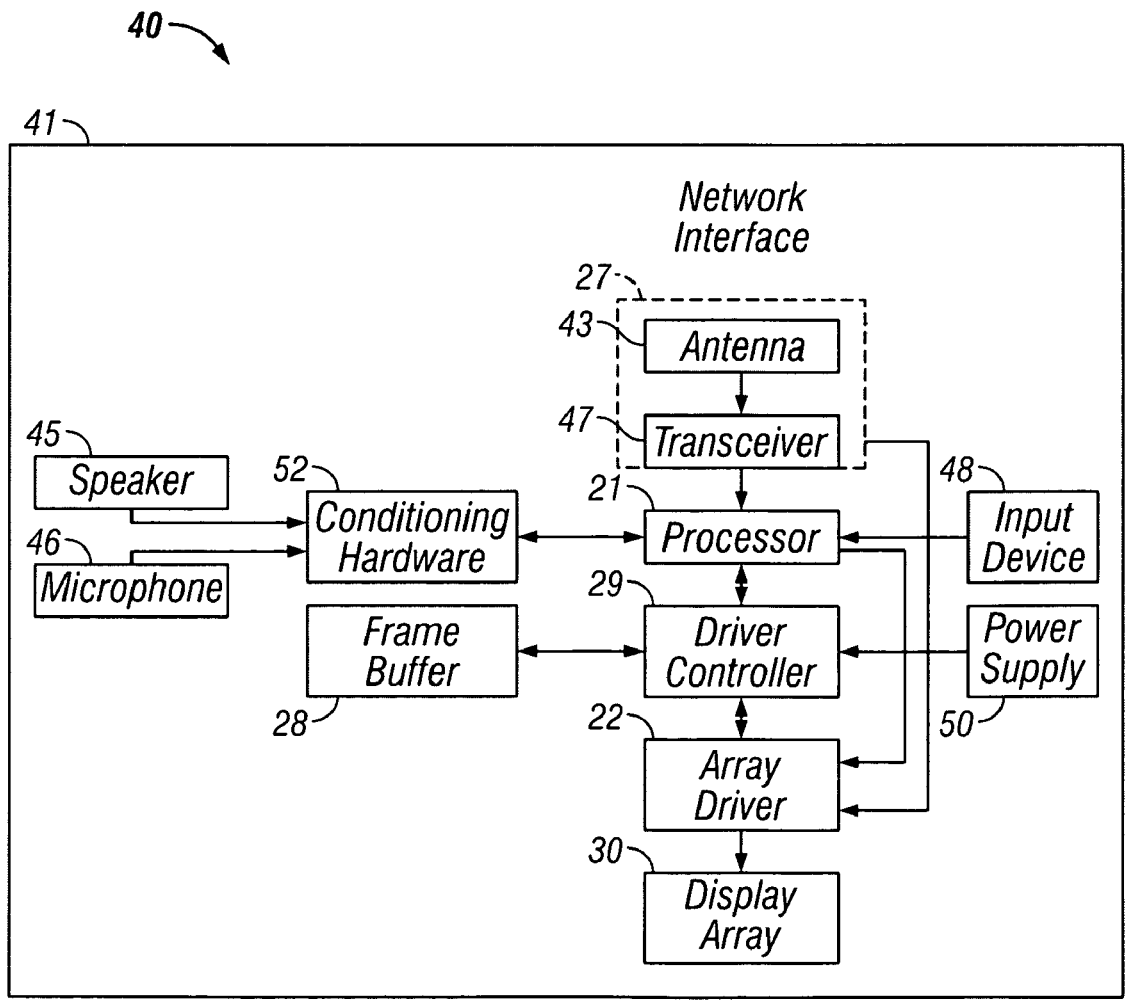

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
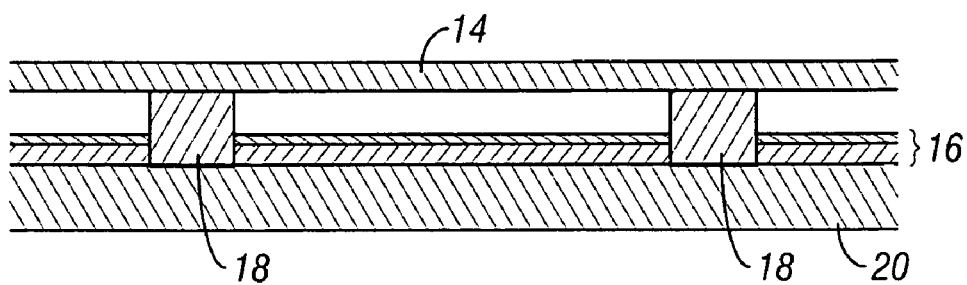
FIG. 7A is a cross section of the device of FIG. 1.
Figure 7B:
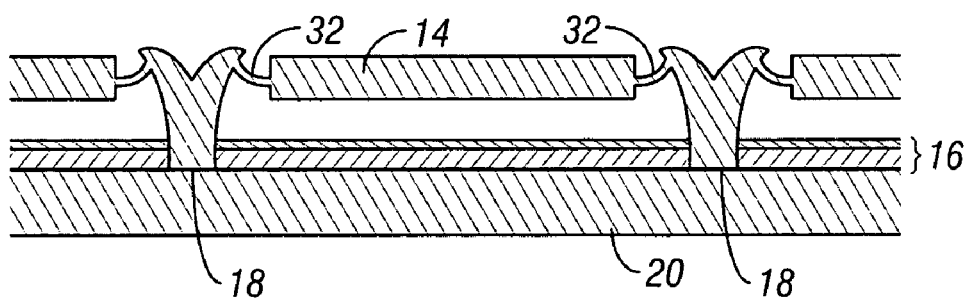
FIG. 7B is a cross section of an alternative embodiment of an interferometric modulator.
Figure 7C:
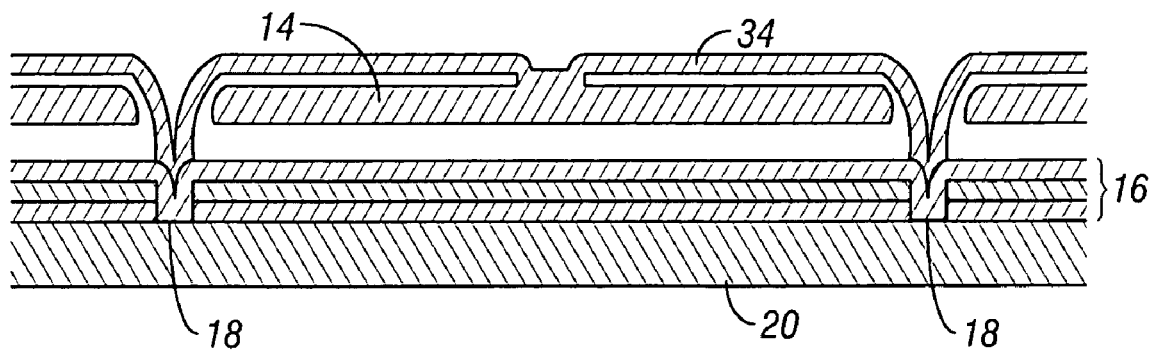
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 7D:
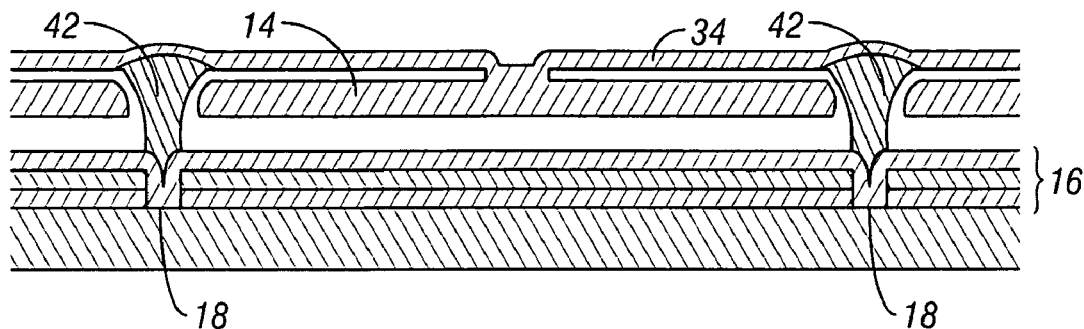
FIG. 7D is a cross section of yet another alternative embodiment of an interferometric modulator.
Figure 7E:
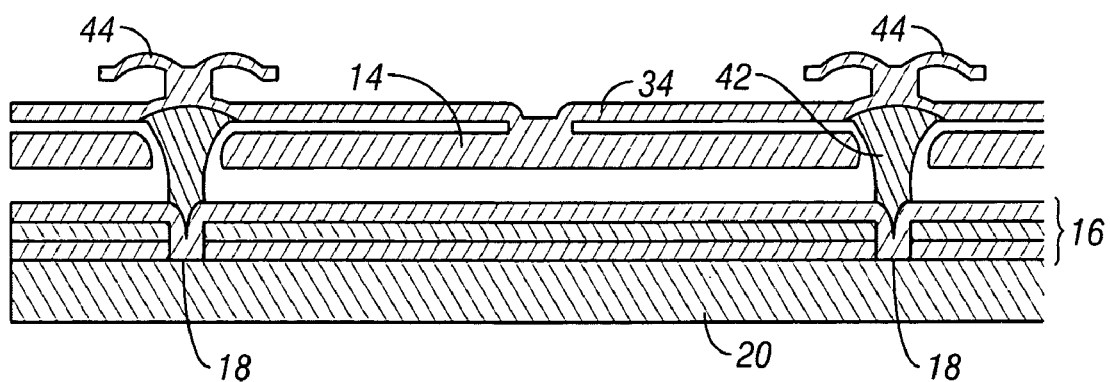
FIG. 7E is a cross section of an additional alternative embodiment of an interferometric modulator.
Figure 8A:
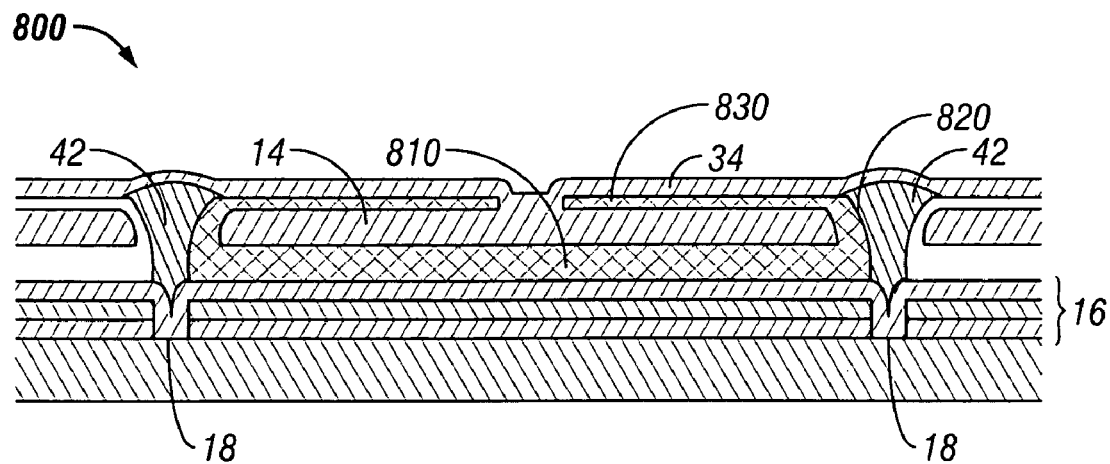
FIG. 8A illustrates a MEMS device before etch release
Figure 8B:
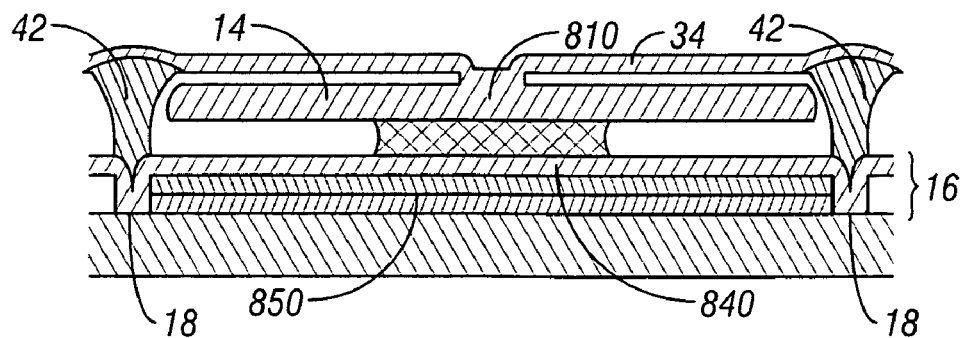
FIG. 8B illustrates a MEMS device part way through an etch release process.

FIGS. 8A and 8B show an interferometric modulator 800 similar in construction to the interferometric modulator shown in FIG. 7D. FIG. 8A shows interferometric modulator 800 during fabrication when the sacrificial material 810 is still entirely present. FIG. 8B shows interferometric modulator 800 during a removal procedure which removes the sacrificial material 810. Typically, the etchant (e.g. $XeF_2$) enters the cavity through openings in the deforming layer 34 (not shown in this view), so the material between the mirror 14 and the deforming layer 34 is removed first. The etching continues around the edges of the mirror 14, and etches toward the central area under the mirror, as seen in FIG. 8B. The area under the middle of the mirror 14 is exposed to the etchant last thus is removed last.

As indicated in FIG. 8B, during the removal procedure, the etching of the sacrificial material 810 generates electric charge, which can build up on the reflective layer 14, and within the electrode layers 850 of the optical stack 16. Under some conditions the amount of charge build up is significant enough to cause large electric fields between the reflective layer 14 and the electrode 850. The forces associated with the large electric fields can be large enough to damage the interferometric modulator by, for example bending the reflective layer 14 and/or the deformable layer 34.

This problem has been mitigated in the past by shorting all the rows and columns of the array together with metal traces deposited on or over the substrate. A trace is connected to each row and column, and the traces are routed to a peripheral area of the substrate where they are shorted together. After the sacrificial material is removed in the etch process, the peripheral area of the substrate where the shorts are located is cut away to remove the shorts.

In one embodiment of the invention, this extra manufacturing step of cutting away the short circuits is avoided by using sacrificial material to create the shorts. The sacrificial material is etched away during the same etch process that is applied to the display array, resulting in a short circuit while the display array sacrificial material is being etched, and an open circuit at the end of the etch process. As described further below, the switch may be fabricated along with the display elements, and it's features controlled to produce a switch that opens at the desired time during the device fabrication process.

Figure 9:
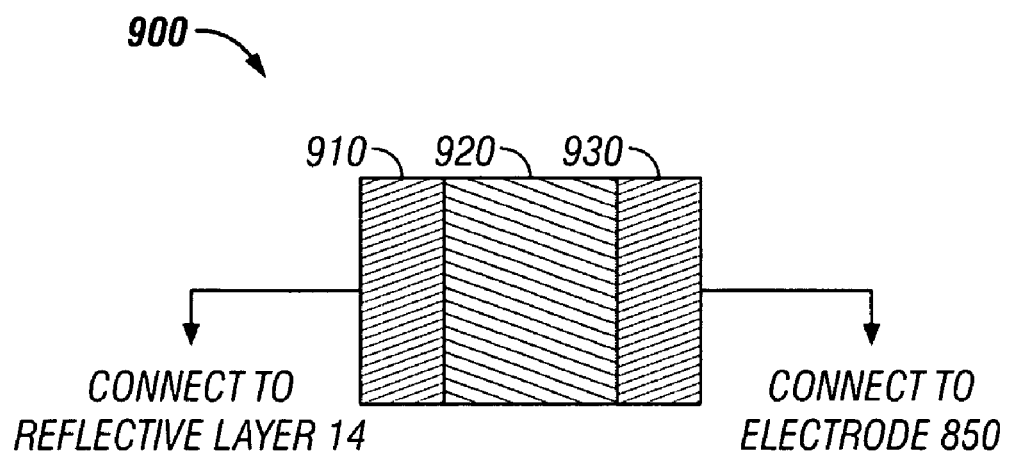
FIG. 9 illustrates an etchable shorting switch.

FIG. 9 is a cross-sectional illustration of a MEMS device 900 having first and second conductive layers 910 and 930 separated by sacrificial layer 920. Because the sacrificial layer 920 is also conductive (e.g. molybdenum, titanium, or tungsten), the layers 910 and 930 are electrically connected. The layers 910 and 930 remain electrically connected during a sacrificial layer 920 removal procedure until the sacrificial layer 920 is removed. As such, the MEMS device 900 can perform as an electrical switch which is closed at the beginning of the sacrificial layer removal procedure, and remains closed until the removal procedure has removed the sacrificial layer 920. With the sacrificial layer 920 removed, MEMS switch 900 is electrically open, and remains open thereafter.

MEMS switch 900 can be used to protect MEMS structures susceptible to damage caused by etch-induced charge build-up. While not limited thereto, switch embodiments will now be described which protect interferometric modulators, such as interferometric modulator 800 of FIG. 8, during the manufacturing process. Structures such as illustrated in FIG. 9 can be manufactured on the substrate with the same manufacturing steps used to manufacture the display elements. As shown in FIG. 9, the first and second-conductive layers 910 and 930 can be electrically connected to the reflective layer 14 and the electrode 850 of FIG. 8. As a result of this connection, during the removal of the sacrificial layers, the reflective layer 14 and the electrode 850 remain electrically connected by the shorting switch 900 until the sacrificial layer 920 is removed. If the reflective layer 14 and the electrode 850 remain electrically connected for the entire duration of the removal of the sacrificial material 810 of FIG. 8, the charge generated during the etching of these sacrificial layers will not build up on the reflective layer 14 and the electrode 850, but rather will be conducted away by the shorting switch 900. As a result, electromotive forces will not be generated, and the interferometric modulator 800 will not suffer damage.

Figure 10:
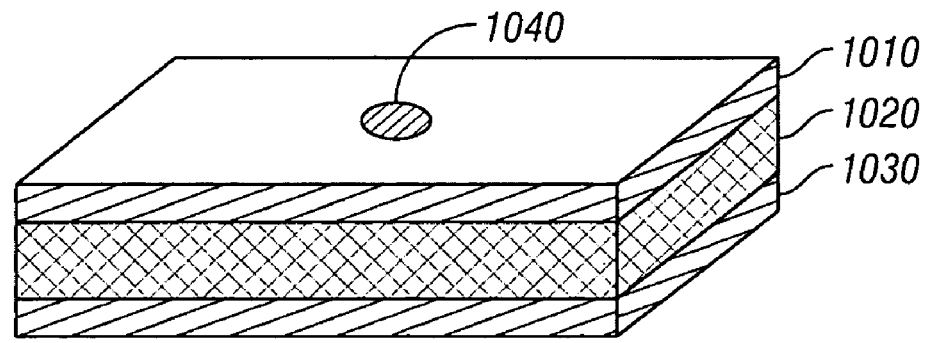
FIG. 10 illustrates another embodiment of an etchable shorting switch.

FIG. 10 is a perspective view illustration of a MEMS switch 1000 which can be used to protect an interferometric modulator. MEMS switch 1000 has first and second conductive layers 1010 and 1030, and a conductive sacrificial layer 1020 between the first and second layers 1010 and 1030. In addition, MEMS switch 1000 has a hole 1040 in the layer 1010.

MEMS switch 1000 has various features which ensure that MEMS switch 1000 is configured to open during a sacrificial layer removal procedure only after the sacrificial layers of the protected interferometric modulator are removed. The overall dimensions of MEMS switch 1000 can be arranged so as to be large enough that the removal procedure will remove the sacrificial layers of the protected interferometric modulator before the material is completely removed from the MEMS switch 1000. Another feature configured to affect the etching rate of the MEMS switch 1000 may the size of the hole(s) 1040. The etching agent gains access to the sacrificial layer 1020 through the hole(s) 1040, and the etched material is removed through hole(s) 1040. Accordingly, a smaller hole 1040 will result in slower etching. Some embodiments may have multiple holes 1040, each with a size configured to influence the etching of the sacrificial layer 1020.

In some embodiments the protecting switch can have features similar to the interferometric modulator being protected. The features can be modified so as to assure that the switch opens after the interferometric modulator sacrificial layers are fully removed.

Figure 11A:
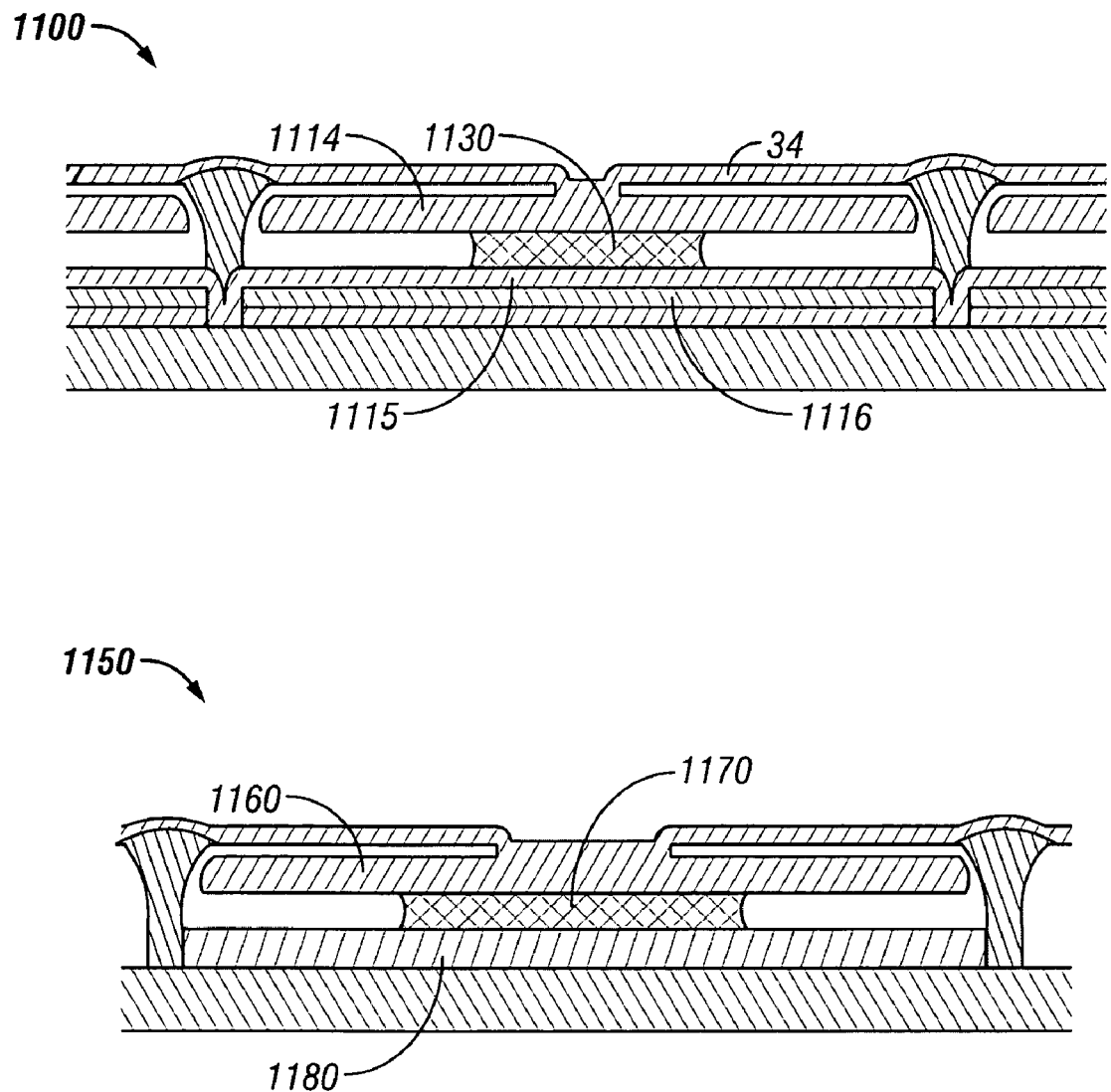
FIG. 11A illustrates an interferometric modulator and a shorting switch part way through an etch release process.
Figure 11B:
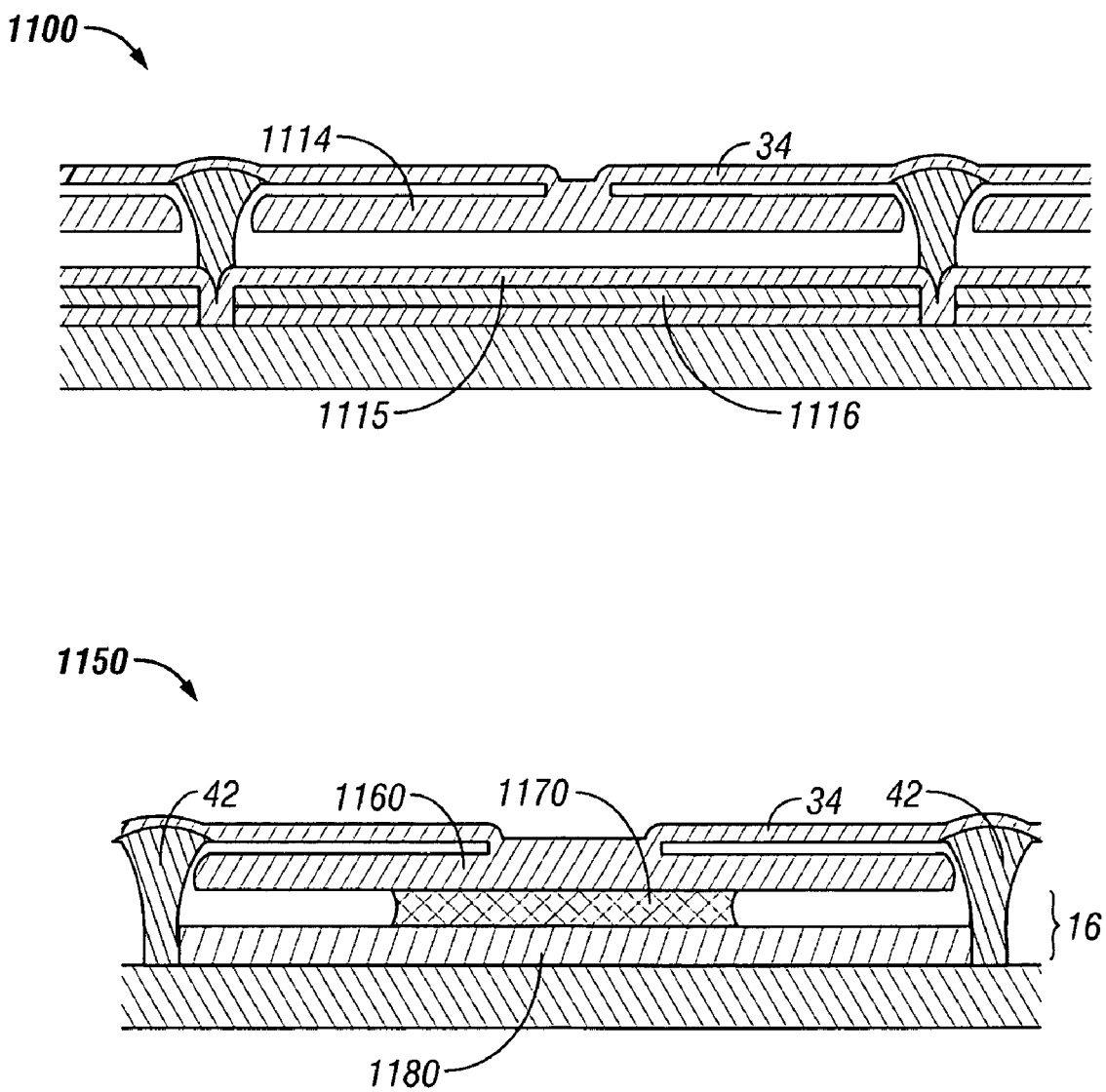
FIG. 11B illustrates the interferometric modulator and switch of FIG. 11A after etch of the interferometric modulator is complete.
Figure 11C:
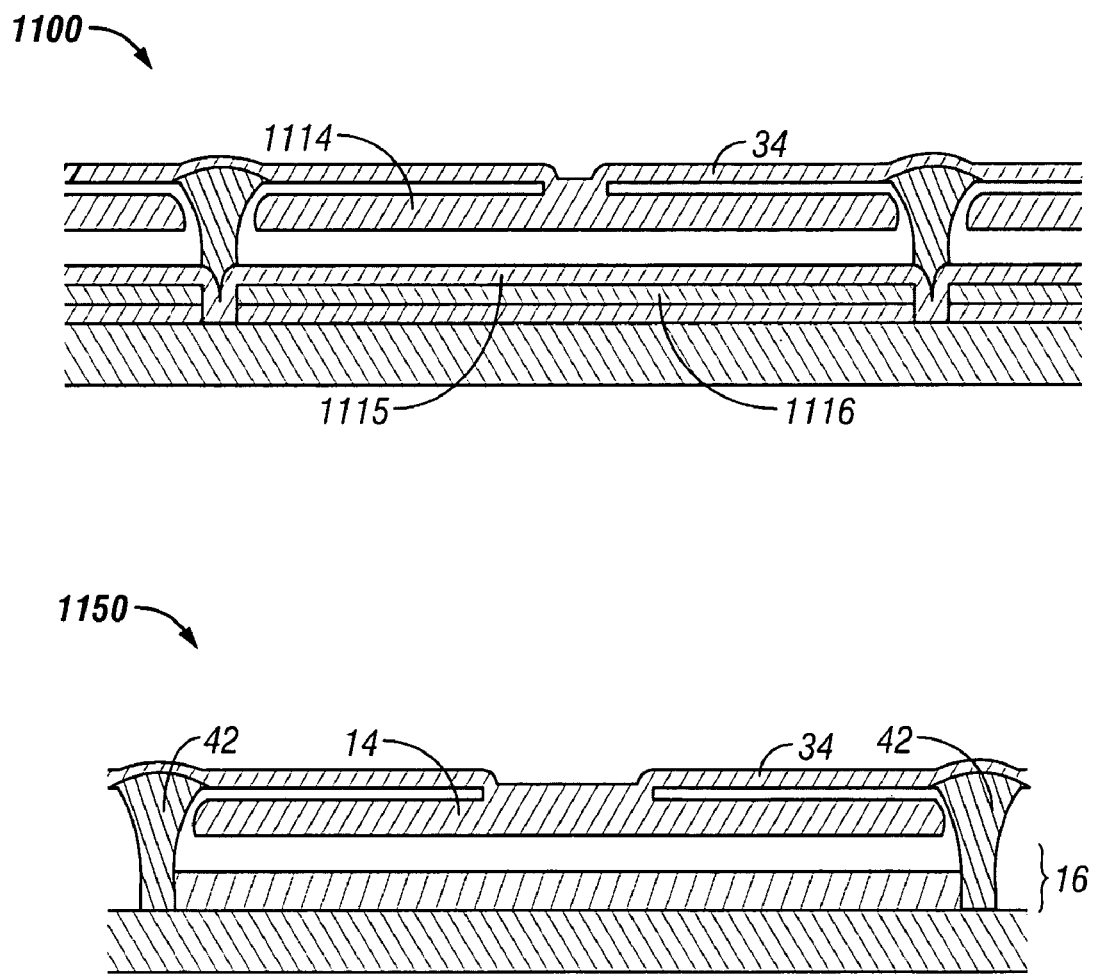
FIG. 11C illustrates the interferometric modulator and switch of FIG. 11A after etch of the interferometric modulator and switch are both complete.

FIGS. 11A, 11B and 11C are cross-sectional illustrations showing an interferometric modulator 1100 and a protecting switch 1150 at three stages of a sacrificial layer removal process. As may be seen, protecting switch 1150 is configured to have similar construction as that of interferometric modulator 1100. Protecting switch 1150 is, however, wider than interferometric modulator 1100. FIGS. 11A, 11B and 11C show the interferometric modulator 1100 with sacrificial layer 1130 between reflective layer 1114 and dielectric 1115, which is above electrode 1116. These figures also show the switch 1150 with sacrificial layer 1170 between conductive layers 1160 and 1180.

FIG. 11A shows the interferometric modulator 1100 with the sacrificial layer 1130 partially etched. Accordingly, as discussed above, the etching action generates charges (not shown). FIG. 11A also shows switch 1150 with the sacrificial layer 1170 partially etched. Accordingly, switch 1150 is electrically closed. As a result, when conductive layers 1160 and 1180 are connected to interferometric modulator reflective layer 1114 and electrode 1116 (connection not shown), reflective layer 1114 and electrode 1116 are electrically shorted, and the etch-generated charges are conducted away from the interferometric modulator 1100 by the switch 1150. Consequently, potentially damaging electromotive forces are avoided.

FIG. 11B shows the interferometric modulator 1100 with the sacrificial layer 1130 fully etched. Accordingly, as discussed above, the etching action no longer generates charges. FIG. 11B also shows switch 1150 with the sacrificial layer 1170 only partially etched. The sacrificial layer 1170 is only partially etched because the switch 1150 is wider than the interferometric modulator 1100. Accordingly, switch 1150 is still electrically closed. As a result, when conductive layers 1160 and 1180 are connected to interferometric modulator reflective layer 1114 and electrode 1116 (connection not shown), reflective layer 1114 and electrode 1116 are still electrically shorted. Accordingly, interferometric modulator 1100 remains protected throughout the period during which charges are generated by the etching.

FIG. 11C shows the interferometric modulator 1100 with the sacrificial layer 1130 fully etched, and the switch 1150 with the sacrificial layer 1170 fully etched. Accordingly, switch 1150 is electrically open. As a result, although conductive layers 1160 and 1180 are connected to interferometric modulator reflective layer 1114 and dielectric 1115 (connection not shown), reflective layer 1114 and electrode 1116 are electrically isolated. Accordingly, interferometric modulator 1100 remained protected throughout the period during which charges are generated by the etching, and are subsequently electrically isolated for normal operation.

Figure 12A:
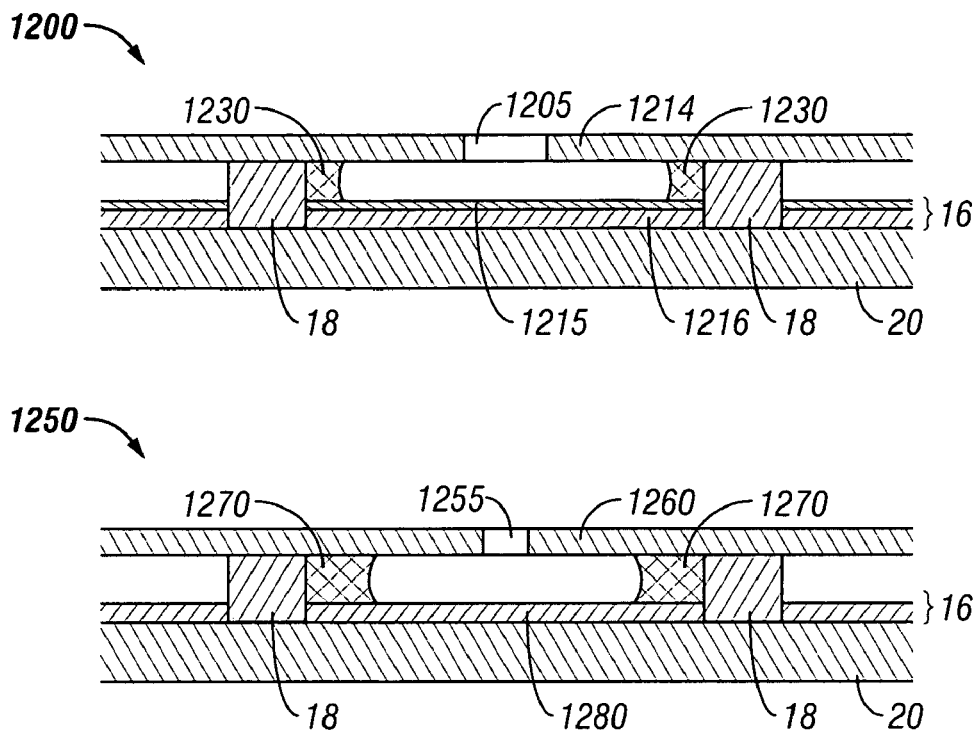
FIGS. 12A, B, and C illustrate the same process as FIGS. 11A, B, and C with a different interferometric modulator and switch design.
Figure 12B:
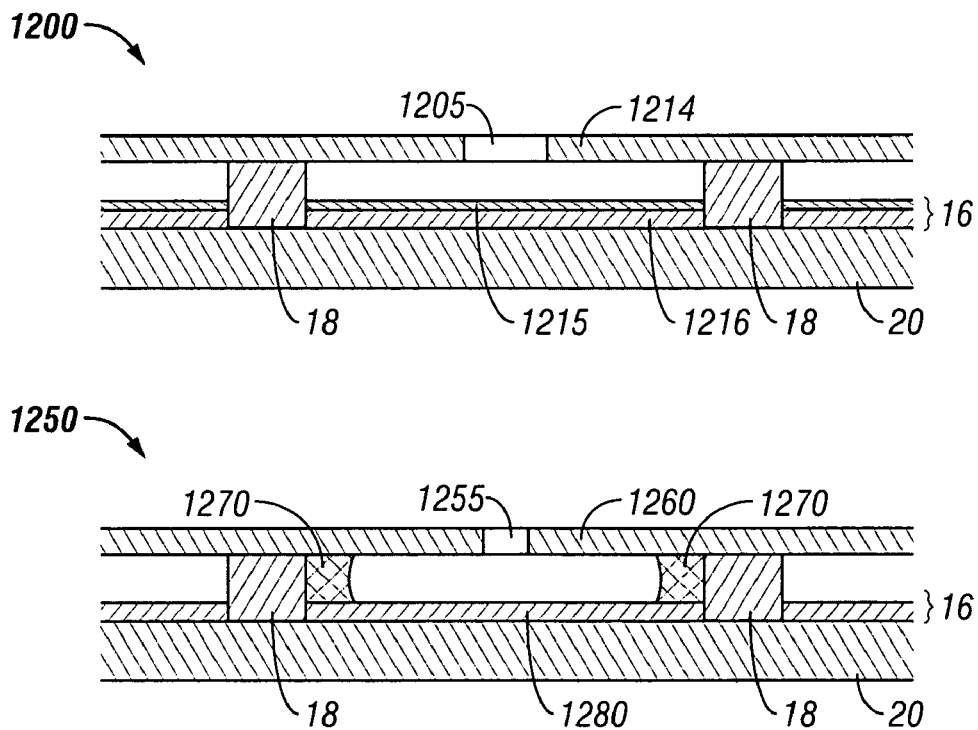
Figure 12C:
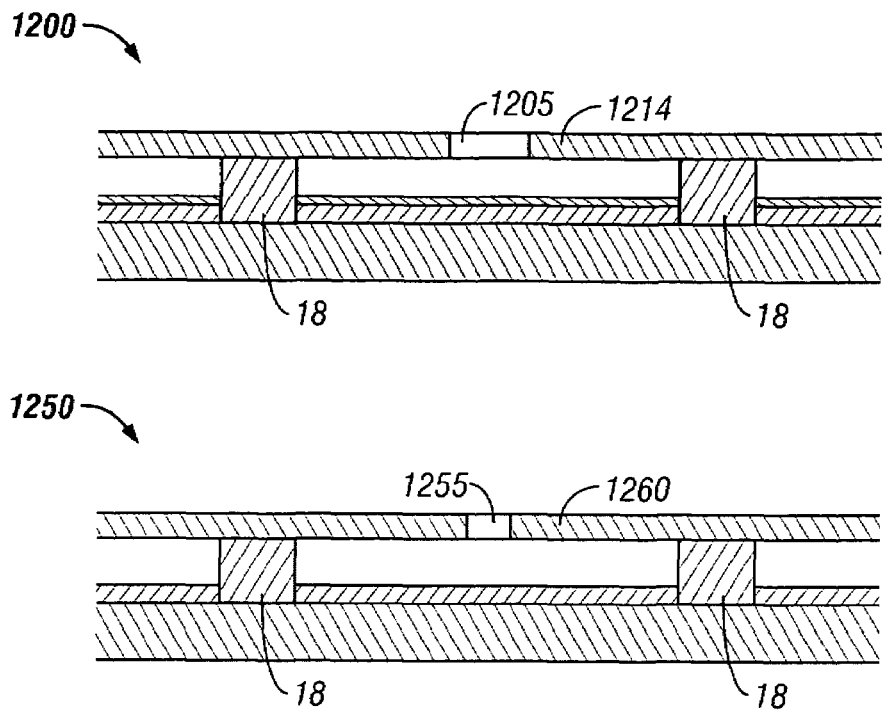

FIGS. 12A, 12B and 12C are cross-sectional illustrations showing another embodiment of an interferometric modulator and another embodiment of a protecting switch. As may be seen, protecting switch 1250 is configured to have similar construction as that of interferometric modulator 1200. These figures show the interferometric modulator 1200 with sacrificial layer 1230 between reflective layer 1214 and dielectric 1215, which is above electrode 1216. These figures also show the switch 1250 with sacrificial layer 1270 between conductive layers 1260 and 1280. Also shown are etch access holes 1205 and 1255 in the reflective layer 1214 and the conductive layer 1260, respectively. Hole 1205 is smaller than hole 1255 so as to assure that the etch time for the sacrificial layer 1270 of the switch 1250 is longer than the etch time of the sacrificial layer 1230 of the interferometric modulator 1200. FIGS. 12A, 12B and 12C show interferometric modulator 1200 and a protecting switch 1250 at three stages during a sacrificial layer removal process.

FIG. 12A shows the interferometric modulator 1200 with the sacrificial layer 1230 partially etched. Accordingly, as discussed above, the etching action generates charges (not shown). FIG. 12A also shows switch 1250 with the sacrificial layer 1270 partially etched. Accordingly, switch 1250 is electrically closed. As a result, when conductive layers 1260 and 1280 are connected to interferometric modulator reflective layer 1214 and electrode 1216 (connection not shown), reflective layer 1214 and electrode 1216 are electrically shorted, and the etch-generated charges are conducted away from the interferometric modulator 1200 by the switch 1250. Consequently, potentially damaging electromotive forces are avoided.

FIG. 12B shows the interferometric modulator 1200 with the sacrificial layer 1230 fully etched. Accordingly, as discussed above, the etching action no longer generates charges. FIG. 12B also shows switch 1250 with the sacrificial layer 1270 only partially etched. Accordingly, switch 1250 is still electrically closed. As a result, because conductive layers 1260 and 1280 are connected to interferometric modulator reflective layer 1214 and electrode 1216 (connection not shown), reflective layer 1214 and electrode 1216 are still electrically shorted. Accordingly, interferometric modulator 1200 remains protected throughout the period during which charges are generated by the etching.

FIG. 12C shows the interferometric modulator 1200 with the sacrificial layer 1230 fully etched, and the switch 1250 with the sacrificial layer 1270 fully etched. Accordingly, switch 1250 is electrically open. As a result, although conductive layers 1260 and 1280 are connected to interferometric modulator reflective layer 1214 and dielectric 1215 (connection not shown), reflective layer 1214 and dielectric 1215 are electrically isolated. Accordingly, interferometric modulator 1200 remains protected throughout the period during which charges are generated by the etching, and are subsequently electrically isolated for normal operation.

In the embodiments shown as switch 1150 and 1250 of FIGS. 11A-C and 12A-C, the sacrificial layers 1170 and 1270 comprise the same material as the sacrificial layers of the interferometric modulators 1100 and 1200, respectively. In some embodiments sacrificial layers 1170 and 1270 may additionally or alternatively comprise other materials. For example, one switch embodiment has a sacrificial layer with a material which has a slower etch rate than the sacrificial layer of the corresponding interferometric modulator. In some embodiments, a switch with a sacrificial layer requiring a separate removal procedure is used. In such embodiments, the sacrificial layer of the interferometric modulators is removed in one or more fabrication steps, and at least a portion of the sacrificial layer of the switch is removed in one or more subsequent steps.

Figure 13:
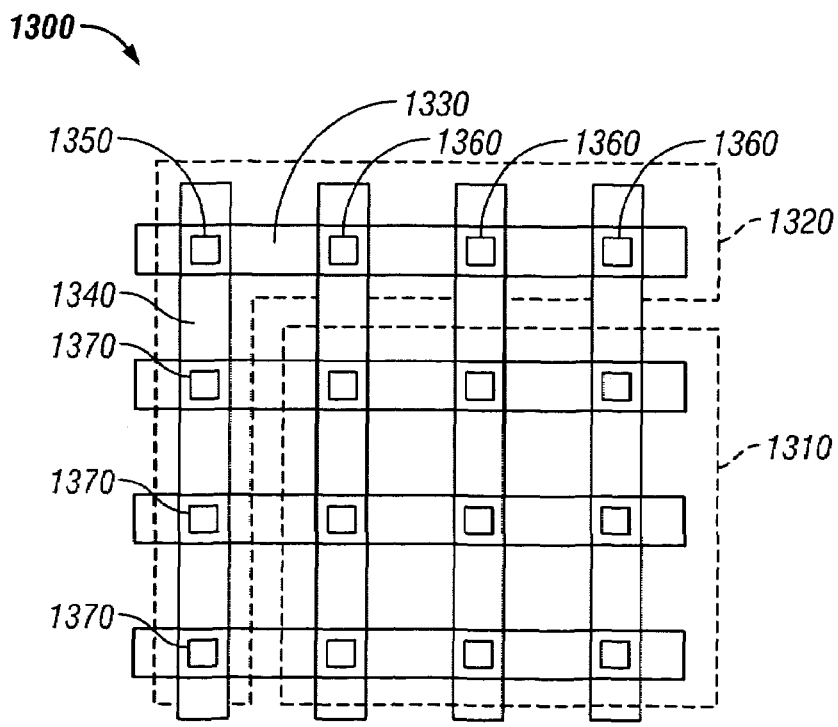
FIG. 13 illustrates a layout of an array of display elements and shorting switches.

FIG. 13 is a diagram illustrating an arrangement of switches which can be used for protecting an array of interferometric modulators. Interferometric modulator array 1310 is configured to be protected by switch bank 1320. Other arrangements and configurations may also be used. The switches of switch bank 1320 are arranged such that one column switch 1360 is connected to each column of the interferometric modulator array 1310. Each column switch 1360 shares a common upper layer with the interferometric modulators of the column to which the column switch 1360 is connected. In some embodiments, the shared common upper layer is a reflective layer similar to any of the reflective layers 14 of FIGS. 7A-7E. The sacrificial layers (not shown) of the column switches 1360 electrically connect each of the columns to a common row electrode 1330. Similarly, the switches of switch bank 1320 are arranged such that one row switch 1370 is connected to each row of the interferometric modulator array 1310. Each row switch 1370 shares a common lower layer with the interferometric modulators of the row to which the row switch 1370 is connected. In some embodiments, the shared common lower layer is a row electrode similar to any of the row electrodes within the optical stacks 16 of FIGS. 7A-7E. The sacrificial layers (not shown) of the row switches 1370 electrically connect each of the rows to a common column electrode 1340. Switch bank 1320 also has a switch 1350 which electrically connects the common row electrode 1330 of the column switches 1360 with the common column electrode 1340 of the row switches 1370. Accordingly, the sacrificial layer of switch 1350 electrically connects all of the columns of the interferometric modulator array 1310 with all of the rows of the interferometric modulator array 1310.

As described above regarding the switches and interferometric modulators of FIGS. 11, and 12, a relationship between the switches of switch bank 1320 and the interferometric modulators of array 1310 is such that during fabrication, the sacrificial layer of the switches remain sufficiently intact so as to electrically connect the upper and lower layers of the switches through the entire period during which the sacrificial layers of the interferometric modulator array 1310 are being removed. This ensures that even though the removal of the sacrificial layers of the interferometric modulator array 1310 may generate charges, the charges will not build up on the interferometric modulators, but will rather be conducted away through the column and row switches to the switch 1350 of the switch bank 1320. Subsequent to the substantially complete removal of the sacrificial layers of the interferometric modulator array 1310, the sacrificial layers of the switches of the switch bank 1320 are removed. Removal of the sacrificial layers of the switches of the switch bank 1320 allows for the each of the rows and each of the columns of the interferometric modulator array 1320 to be electrically independent for normal operation. In some embodiments the sacrificial layer of switch 1350 need not be removed.

While the above detailed description has shown, described, and pointed out novel features as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of manufacturing a MEMS (microelectromechanical system) device, the method comprising:
   forming a first layer on a substrate;
   forming a sacrificial layer on or over the first layer, the sacrificial layer configured to be removed in a removal procedure;
   forming a second layer on or over the first sacrificial layer, wherein the second layer is spaced apart from the first layer; and
   forming a shorting element electrically connecting the first and second layers, wherein at least a portion of the shorting element is configured to electrically connect the first and second layers after the sacrificial layer has been removed during the removal procedure, and wherein the shorting element is configured to be removed during the removal procedure.

2. The method of claim 1, additionally comprising performing the removal procedure.

3. The method of claim 2, wherein the removal procedure comprises opening the shorting element, wherein the first and second layers become electrically isolated.

4. The method of claim 3, wherein the first sacrificial layer is removed prior to opening the shorting element.

5. The method of claim 2, wherein performing the removal procedure comprises substantially simultaneously subjecting the sacrificial layer and the shorting element to one or more common manufacturing steps.

6. The method of claim 2, wherein performing the removal procedure comprises etching.

7. The method of claim 2, wherein forming the shorting element comprises forming a second sacrificial layer, and wherein the removal procedure comprises etching at least one of the first and second sacrificial layers.

8. The method of claim 7, wherein at least part of the first and second sacrificial layers are formed simultaneously.

9. The method of claim 1, further comprising forming an interferometric light modulation cavity between the first and second layers.

10. The method of claim 1, wherein the substrate comprises glass.

11. The method of claim 1, wherein the shorting element comprises at least one of molybdenum, tungsten, and titanium.

12. The method of claim 1, wherein the sacrificial layer is configured to be removed with an etchant comprising $XeF_2$.

13. The method of claim 1, further comprising:
   forming a first structure comprising the first and second layers, and a first etching agent access passage; and
   forming a second structure comprising the shorting element, and a second etching agent access passage, wherein the first etching agent access passage is configured to allow the first sacrificial layer to be removed before the shorting element is opened.

14. The method of claim 1, wherein removing the sacrificial layer induces electrical charge build-up.

15. A method of manufacturing a MEMS (microelectromechanical system) device, the method comprising:
   forming a first layer on a substrate;
   forming a sacrificial layer on or over the first layer, the sacrificial layer configured to be removed in a removal procedure;
   forming a second layer on or over the first sacrificial layer, wherein the second layer is spaced apart from the first layer;
   forming a shorting element electrically connecting the first and second layers, wherein at least a portion of the shorting element is removable in the removal procedure;
   forming an array of MEMS elements, the array comprising a plurality of addressing lines;
   forming at least one connection pad; and
   forming a plurality of switches configured to selectively connect two or more of the addressing lines to the connection pad.

16. The method of claim 15, further comprising forming one or more of the plurality of switches an area designated for occupation by a driver circuit.

* * * * *